(12) United States Patent
Takayama et al.

(10) Patent No.: US 7,595,256 B2
(45) Date of Patent: Sep. 29, 2009

(54) SEMICONDUCTOR DEVICE, METHOD OF MANUFACTURING THEREOF, AND METHOD OF MANUFACTURING BASE MATERIAL

(75) Inventors: Toru Takayama, Atsugi (JP); Yuugo Goto, Atsugi (JP); Yumiko Fukumoto, Atsugi (JP); Junya Maruyama, Ebina (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 314 days.

(21) Appl. No.: 11/798,094

(22) Filed: May 10, 2007

(65) Prior Publication Data

US 2007/0218650 A1    Sep. 20, 2007

Related U.S. Application Data

(62) Division of application No. 10/973,426, filed on Oct. 27, 2004, now Pat. No. 7,229,900.

(30) Foreign Application Priority Data

Oct. 28, 2003    (JP) ............................. 2003-368056

(51) Int. Cl.
*H01L 21/30*    (2006.01)
*H01L 21/46*    (2006.01)
(52) U.S. Cl. .................... 438/458; 257/E21.6
(58) Field of Classification Search ............... 438/458; 257/E21.6, E21.601
See application file for complete search history.

(56) References Cited

U.S. PATENT DOCUMENTS 5,882,761 A    3/1999    Kawami et al.
6,808,773 B2    10/2004    Shimamura et al.
6,894,312 B2    5/2005    Yamazaki et al.
6,916,681 B2 *    7/2005    Asano et al. .................. 438/99
7,067,926 B2    6/2006    Yamazaki et al.
7,122,445 B2 *    10/2006    Takayama et al. ........... 438/458
7,147,740 B2    12/2006    Takayama et al.

(Continued)

FOREIGN PATENT DOCUMENTS

EP    1 085 576    3/2001

(Continued)

OTHER PUBLICATIONS

International Search Report and Written Opinion of Apr. 26, 2005 for PCT/JP2004/016180.

*Primary Examiner*—W. David Coleman
(74) *Attorney, Agent, or Firm*—Eric J. Robinson; Robinson Intellectual Property Law Office, P.C.

(57) ABSTRACT

It is an object of the invention to provide a lightweight semiconductor device having a highly reliable sealing structure which can prevent ingress of impurities such as moisture that deteriorate element characteristics, and a method of manufacturing thereof. A protective film having superior gas barrier properties (which is a protective film that is likely to damage an element if the protective film is formed on the element directly) is previously formed on a heat-resistant substrate other than a substrate with the element formed thereon. The protective film is peeled off from the heat-resistant substrate, and transferred over the substrate with the element formed thereon so as to seal the element.

46 Claims, 8 Drawing Sheets

U.S. PATENT DOCUMENTS

| | | |
|---|---|---|
| 7,189,631 B2 * | 3/2007 | Yamazaki et al. ............ 438/458 |
| 7,245,331 B2 * | 7/2007 | Yamazaki et al. ............. 349/45 |
| 7,495,272 B2 * | 2/2009 | Maruyama et al. ........... 257/291 |
| 2002/0121860 A1 | 9/2002 | Seo et al. |
| 2003/0032210 A1 | 2/2003 | Takayama et al. |
| 2005/0006647 A1 * | 1/2005 | Utsunomiya ................. 257/72 |
| 2005/0112805 A1 | 5/2005 | Goto et al. |

FOREIGN PATENT DOCUMENTS

| | | |
|---|---|---|
| EP | 1 220 339 | 7/2002 |
| EP | 1 363 319 | 11/2003 |
| EP | 1 389 901 | 2/2004 |
| JP | 09-148066 | 6/1997 |
| JP | 10-106746 | 4/1998 |
| JP | 2793048 | 6/1998 |
| JP | 2001-203076 | 7/2001 |
| JP | 2001-217072 | 8/2001 |
| JP | 2002-324680 | 11/2002 |
| JP | 2003-174153 | 6/2003 |
| JP | 3451825 | 7/2003 |
| JP | 2003-258488 | 9/2003 |
| JP | 2003-295791 | 10/2003 |
| JP | 2003-298284 | 10/2003 |
| WO | WO 02/096178 | 11/2002 |
| WO | WO 2005/041249 | 5/2005 |

* cited by examiner

US 7,595,256 B2

SEMICONDUCTOR DEVICE, METHOD OF MANUFACTURING THEREOF, AND METHOD OF MANUFACTURING BASE MATERIAL

This application is a divisional of Ser. No. 10/973,426 filed Oct. 27, 2004, now U.S. Pat. No. 7,229,900 B2.

BACKGROUND OF THE INVENTION

1. Field of the Invention

The present invention relates to a semiconductor device having a circuit that is formed of a thin film transistor (hereinafter referred to as a TFT), and a method of manufacturing thereof. Specifically, the present invention relates to an electronic appliance mounted with an electro-optic device or a light emitting display device having an organic light-emitting element typified by a liquid crystal display panel as a component.

It should be note that the term "a semiconductor device" indicates all kinds of devices that can behave by utilizing semiconductor characteristics, and includes all of an electro-optic device, a semiconductor circuit, and an electronic appliance.

Further, the present invention relates to a method of manufacturing a base material including a protective film, which is superior in barrier properties.

2. Description of the Related Art

In recent years, a technique for forming a thin film transistor (a TFT) by using a semiconductor thin film (with a thickness of about from several nm to several hundreds nm) that is formed over a substrate having an insulated surface has been attracting attention. The thin film transistor has been widely applied in electronic devices such as an IC and an electro-optic device. In particular, development related to the thin film transistor as a switching element of an image display device has been hurried.

Various applications utilizing such a image display device have been expected, and particularly, application to a portable device has been attracting much attention. As a substrate for forming the TFTs, a glass substrate and a quartz substrate has been widely used now, however, these substrates have some drawbacks of being fragile and heavy. Further, these substrates are unsuitable for mass-production since the surface area thereof is difficulty enlarged. Therefore it has been attempted that an element including TFTs is formed over a substrate having flexibility as typified by a flexible plastic film.

In the case of using the flexible plastic substrate, however, the maximum temperature of the process should be lowered since the plastic film has low heat resistance. Therefore, it has been impossible to form a TFT having as good characteristics as that formed over a glass substrate. Thus, a high-performance liquid crystal display device or light emitting element using a plastic film has not been realized yet.

Further, the plastic film has a drawback of poor barrier properties. Even when a protective film having good barrier properties is provided in order to compensate the drawback, since the plastic film has low heat resistance, it is necessary to reduce the maximum temperature of a film formation process. Therefore, a favorable protective film cannot be obtained. Accordingly, a highly reliable electronic device using the plastic film has not been realized yet.

Particularly, since an EL display device (panel) using an EL element is sensitive to moisture, it is assumed that far superior gas barrier properties are required.

With respect to the EL display device (panel) using an EL element, moisture penetrating into the device causes a serious deterioration in the reliability of the EL display device, which further causes dark spots, shrinkage, and deterioration in luminance from the periphery of a light emitting display device. The dark spots are phenomena in which the luminance is partially decreased (including a phenomenon of non-light emission), and caused in the case where a hole is formed in an upper electrode. The shrinkage is a phenomenon in which the luminance is deteriorated from edge of pixels.

Consequently, development related to a display device having a structure for preventing the above-mentioned deteriorations in the EL element has been carried out. For example, there is a technique for preventing the deterioration of the EL element as follows (for example, see patent document 1): an EL element is encapsulated in an airtight container so as to protect the EL element from outside air, and a desiccant is provided apart from the EL element in the airtight space.

Further, there is another method for preventing the deterioration of the EL element as follows (for example, see patent document 2): a sealing material is formed on an insulator with an EL element formed thereon, an airtight space surrounded by a cover member and the sealing material is filled with a filler that is composed of resin and the like so that the EL element is shielded from the outside air.

Furthermore, the patent document 3 discloses a structure in which an electrode over a luminescent layer is coated with a water-shedding protective film, and a plate such as glass is attached firmly thereon.

Also, the patent document 4 discloses a structure in which a light curable resin is applied over an EL element and cured by being irradiated with light to seal a two-layered film, thereby protecting the EL element mechanically.

Patent document 1: Japanese Patent Application Laid-Open No. Hei 9-148066
Patent document 2: Japanese Patent Application Laid-Open No. Hei 13-203076
Patent document 3: Japanese Patent Application Laid-Open No. Hei 10-106746
Patent Document 4: Japanese Patent No. 2793048

When the film thickness of a passivation film made from an inorganic insulating film is increased in order to prevent intrusion of impurities into a semiconductor element, e.g., intrusion of moisture and the like into an EL element, stress thereof is also increased, and hence, cracking is easily caused.

In the case where a protective film is formed over an entire surface of a substrate with elements formed thereon by PCVD or application, an external extraction terminal portion is also covered with the protective film. Therefore, it has been necessary that the substrate be selectively etched to expose the external extraction terminal portion. Meanwhile, in the case of using the sputtering technique, although the protective film can be selectively formed with use of a metal mask, there is a risk of damaging the elements formed over the substrate due to the sputtering.

Moreover, when a glass substrate is used as a sealing substrate and adhered to a substrate with elements formed thereon to encapsulate the elements, there have been drawbacks of being easily broken and heavy.

SUMMARY OF THE INVENTION

It is an object of the present invention to provide a semiconductor device having a highly reliable sealing structure, which is lightweight and prevents impurities such as moisture causing deterioration in characteristics of elements, and a method of manufacturing thereof.

It is another object of the invention to provide a method of manufacturing a base material having a protective film which is superior in barrier properties, besides an electronic appliance.

One feature of the invention is that a protective film having high gas barrier properties is formed over a heat-resistant substrate in advance that is different of a substrate with elements formed thereon, and only the protective film is peeled off and transferred over the substrate with the elements formed thereon. As an adhesive material for transferring the protective film, various kinds of adhesive materials such as a reactive curing adhesive material, a heat curing adhesive material, a light curing adhesive material, and an anaerobic curing adhesive material can be cited. These adhesive materials may be formed of, for example, epoxy, acrylate, silicon, and the like.

In accordance with the invention, since the protective film is previously formed, the protective film may be simply separated from the substrate and transferred over the other substrate with elements formed thereon as a sealing treatment, which allows the elements to be sealed at short times. On the other hand, the ingress of moisture has conventionally been necessary to be prevented during the formation of the protective film on the elements, and therefore, it has been difficult to encapsulate the elements at short times.

Alternatively, the elements may be encapsulated as follows: a protective film having excellent gas barrier properties is previously formed over a heat-resistant substrate that is different of a substrate with the elements formed thereon, only the protective film is transferred over a plastic substrate, and then the plastic substrate as a sealing film is attached to the substrate with the elements formed thereon.

The present invention is effective in the case where the elements might be damaged by the protective film having excellent gas barrier properties if the protective film is directly formed on the elements. For example, the protective film having superior gas barrier properties is preferably formed of a thermal curable organic resin film, a light curable organic resin film, a film obtained by applying and baking a solution containing polysilazane or siloxane polymer.

When a solution containing polysilazane is directly applied on the elements formed over a substrate and baked, the solution is necessary to be baked at temperatures of from 120° C. to 450° C., preferably from 250° C. to 400° C. Therefore, the elements and substrate must withstand the baking temperatures. Further, degasification of hydrogen, ammonium, and the like is caused upon baking the solution containing polysilazane. Similarly, there is fear that the degasification of various materials is caused at the time of baking the organic resin films, and the degasification thereof adversely affects the elements. Conventionally, it has been difficult to reduce a dew point since spin coating is performed under atmospheric pressure. Particularly, a light emitting element having a layer containing an organic compound as a light emitting layer is easily damaged by moisture, ultraviolet light, degasification, and heat. Accordingly, the protective film has been difficultly formed on the light emitting element, directly.

In addition, since a spin coating treatment and baking treatment are necessary for the application, there is fear that moisture is penetrated into the light emitting element during steps for performing these treatments. According to the invention, however, the protective film is not formed on the elements directly, but the protective film, which is formed over the heat-resistant substrate by application in advance, is simply transferred on the light emitting element formed over the plastic substrate. Therefore, moisture does not penetrate into the elements due to the application step.

As the other examples of the protective film having superior gas barrier properties, the following protective films are preferably used: dense inorganic insulating films formed by PCVD (such as a SiN film and a SiNO film); dense inorganic insulating films formed by sputtering (such as a SiN film and a SiNO film); thin films containing carbon as its principal constituent (such as a DLC film, a CN film, and an amorphous carbon film); metal oxide films (such as $WO_2$, $CaF_2$, $Al_2O_3$); and the like.

A diamond like carbon film (also referred to as a DLC film) can be formed by plasma CVD (typically, RF plasma CVD, microwave CVD, electron cyclotron resonance (ECR) CVD, hot-filament CVD); a combustion flame method; sputtering; ion-beam evaporation; laser evaporation; and the like. As reactive gases used for film formation, a hydrogen gas and a hydrocarbon gas (e.g., $CH_4$, $C_2H_2$, $C_6H_6$, and the like) are used. The reactive gases are ionized by glow discharge, and resultant ions are accelerated and impacted to a cathode which is negatively self-biased to form a film. The CN film may be formed by using $C_2H_4$ gas and $N_2$ gas as the reactive gases. The DLC film and the CN film are insulating films that are transparent or translucent to visible light, though the transparency and translucency thereof depend on their film thicknesses. The insulating film which transparent to visible light means that the film has 80 to 100% transmittance of visible light, whereas the insulating film which translucent to visible light means that the film has 50 to 80% transmittance of visible light.

Since the protective film may not be formed on the elements directly in the invention, conditions for forming the protective film are not limited, thereby obtaining a dense film by using high-density plasma.

Conventionally, there has been a problem in which stress cracking is easily caused if the thickness of the protective film is increased.

According to the invention, a protective film is composed of a lamination film (which has a lamination structure of an inorganic insulating film, an organic resin film, and an inorganic insulating film, or a lamination structure having three or more layers) using an organic resin film as a stress relaxation film so as to prevent film cracking. Consequently, the total thickness of the protective film can be increased.

Further, according to the invention, the protective film can be partly transferred to encapsulate an element while exposing a terminal portion. Also, a laminated protective film can be transferred according to the invention. Conventionally, in the case of directly forming a protective film over an entire surface of a substrate by application to encapsulate an element, the terminal portion has been likely to be covered with the protective film, the surface properties of an electrode for the terminal portion has been likely to be changed due to plasma, or an element formed over the substrate has been likely to be damaged by plasma.

In addition, the present invention is effective in the case of forming a top-emission type light emitting device that is emphasized in the light transmitting properties of the protective film. The top emission type light emitting device can be formed by being attached only with a protective film having superior gas barrier properties without using a transparent substrate for sealing, which degrades the light transmittance slightly.

The invention can be applied to various kinds of protective films, besides the light emitting device. For example, the invention is applicable to protective films for cards, and overcoat layers of plastics products.

According to first aspect of the invention, there is provided a method of manufacturing a base material. The method of manufacturing the base material includes the steps of: forming a layer to be peeled having a protective film, which is formed of an inorganic insulating film, over a first substrate; forming a material film, which is soluble in a solvent, on the layer to be peeled having the protective film; attaching a second substrate on the material film with a first two-sided tape; attaching a third substrate to the bottom of the first substrate with a second two-sided tape; separating the layer to be peeled having the protective film from the first substrate, the second two-sided tape, and the third substrate; attaching a base material to the layer to be peeled having the protective film with an adhesive material; removing the second substrate; removing the first two-sided tape; and removing the material film by being solved with a solvent.

According to the first aspect of the invention, the base material is a film base material. The inorganic insulating film is an SOG film. According to the above-mentioned manufacturing steps, it is possible to obtain a film substrate in that the SOG film, which is necessary to be baked at higher temperatures than the allowable temperature limit of a plastic substrate, is fixed with an adhesive layer.

According to second aspect of the invention, there is provided a method of manufacturing a semiconductor device. The method of manufacturing a semiconductor device includes the steps of: forming a layer to be peeled having a protective film, which is formed of an inorganic insulating film, over a first substrate; forming a material film, which is soluble in a solvent, on the layer to be peeled having the protective film; attaching a second substrate on the material film with a first two-sided tape; attaching a third substrate to the bottom of the first substrate with a second two-sided tape; separating the layer to be peeled having the protective film from the first substrate, the second two-sided tape, and the third substrate; attaching a fourth substrate to the layer to be peeled having the protective film with an adhesive material; removing the second substrate; removing the first two-sided tape; removing the material film by being solved with a solvent; and attaching the fourth substrate with the layer to be peeled having the protective film formed thereon to a fifth substrate so as to cover a semiconductor element formed over the fifth substrate.

The protective film can have a lamination structure. According to third aspect of the invention, there is provided a method of manufacturing the semiconductor device. The method of manufacturing the semiconductor device includes the steps of: forming a layer to be peeled having a protective lamination film, which is formed by laminating an inorganic insulating film and a coating film, over a first substrate; forming a material film, which is soluble in a solvent, on the layer to be peeled having the protective lamination film; attaching a second substrate on the material film with a first two-sided tape; attaching a third substrate to the bottom of the first substrate with a second two-sided tape; separating the layer to be peeled having the protective lamination film from the first substrate, the second two-sided tape, and the third substrate; attaching a fourth substrate to the layer to be peeled having the protective lamination film with an adhesive material; removing the second substrate; removing the first two-sided tape; removing the material film by being solved with a solvent; and attaching the fourth substrate with layer to be peeled having the protective lamination film formed thereon to a fifth substrate so as to cover a semiconductor element formed over the fifth substrate.

According to the second aspect or the third aspect of the invention, the second substrate and the third substrate are substrates having higher rigidity than that of the first substrate. The fourth substrate is a film substrate. Further, the inorganic insulating film is a silicon oxide film, a silicon nitride film, or a silicon oxynitride film that is formed by PCVD, sputtering, or application. Furthermore, the coating film is an organic resin film or an SOG film.

According to the second aspect or the third aspect of the invention, the protective lamination film is composed by laminating the inorganic insulating film, the coating film, and the inorganic insulating film. By using the coating film as a stress relaxation film, it is possible to realize a protective lamination film without causing stress cracking.

In addition, according to another aspect of the invention, there is provided a semiconductor device which can be obtained according to the above-mentioned manufacturing methods, wherein a semiconductor element formed over a substrate is sealed with a first adhesive layer covering the semiconductor element and a flat protective film or a flat protective lamination film fixed to a film substrate by a second adhesive layer.

With respect to the above-described structure of the semiconductor device, the structure is particularly effective in a light emitting device having an EL element, which is required to have superior barrier properties. The light emitting device is applicable to both an active matrix light emitting device and a passive matrix light emitting device.

The light emitting element (EL element) includes a layer containing an organic compound in which luminescence (electroluminescence) is obtained by being applied with an electric field (hereinafter referred to as an EL layer); an anode; and a cathode. Luminescence in the organic compound includes light emission (fluorescence) in returning to a base state from an excited singlet state; and light emission (phosphorescence) in returning to a base state from an excited triplet state. The light emitting device manufactured according to the invention is applicable to the case of using each light emission.

The light emitting element (EL element) having the EL layer includes a structure of sandwiching the EL layer between a pair of electrodes. The EL layer is generally has a lamination structure. Typically, a lamination structure of "a hole transporting layer, a light emitting layer, and an electron transporting layer" can be mentioned as the lamination structure for the EL layer. This lamination structure of the EL layer exhibits extremely high light-emitting efficiency. Therefore, the lamination structure is adopted in almost of all light emitting devices which has been researched and developed now.

Besides, a structure composed by sequentially laminating an anode, a hole injecting layer, a hole transporting layer, a light emitting layer, an electron transporting layer; or a structure composed by sequentially laminating an anode, a hole injecting layer, a hole transporting layer, a light emitting layer, an electron transporting layer, and an electron injecting layer is also applicable in place of the above-mentioned structure. The light emitting layer may be doped with fluorescent pigment and the like. Further, all of the layers may be composed of either low-molecular weight materials or high-molecular weight materials. Also, a layer containing an inorganic material may be employed. Throughout the specification, all layers formed between the cathode and the anode are generically referred to as the EL layer. Accordingly, the EL layer includes all of the above-mentioned hole injecting layer, hole transporting layer, light emitting layer, electron transporting layer, and electron injecting layer.

In the light emitting device of the invention, a method of driving screen display is not particularly limited. For example, a dot sequential driving method, a line sequential driving method, a surface sequential driving method, and the like may be used. A line sequential driving method is typically used, and a time division gray scale driving method or a surface area gray scale driving method may also be appropriately employed. Further, image signals input to a source line of the light emitting device may be either analog signals or digital signals. A driver circuit and the like may be properly designed according to the image signals.

In light emitting devices using digital video signals, there are one in which video signals are input to a pixel at a constant voltage (CV), and one in which video signals are input to a pixel at a constant current (CC). The light emitting devices in which video signals are input to a pixel at a constant voltage (CV) are further classified into one in which a constant voltage is applied to a light emitting element (CVCV), and another one in which a constant current is applied to a light emitting element (CVCC). Also, the light emitting device in which video signals are input to a pixel at a constant current (CC) is classified into one in which a constant voltage is applied to a light emitting element (CCCV), and another one in which a constant current is supplied to a light emitting element (CCCC).

In the light emitting device of the invention, a protection circuit (protection diode) may be provided for the purpose of inhibiting electrostatic discharge damage.

The invention can be applied to any light emitting devices having various kinds of TFT structures, for example, a top-gate TFT, a bottom-gate (inverted-stagger type) TFT, and a staggered TFT. Further, the invention is applicable to a multi-gate TFT having a plurality of channel formation regions such as a double-gate TFT, besides the TFT having a single-gate.

Further, a TFT electrically connected to a light emitting element may be either a p-channel TFt or an n-channel TFT. When the light emitting element is electrically connected to the p-channel TFT, the p-channel TFT may be connected to an anode; a hole injecting layer, a hole transporting layer, a light emitting layer, and an electron transporting layer may be laminated in this order on the anode; and then a cathode may be formed thereon. Alternatively, when the light emitting element is electrically connected to the n-channel TFT, the n-channel TFT may be connected to a cathode; an electron transporting layer, a light emitting layer, a hole transporting layer, and a hole injecting layer may be laminated in this order on the cathode; and then an anode may be formed thereon.

As for an active layer of a TFT, an amorphous semiconductor film, a semiconductor film including a crystalline structure, a compound semiconductor film including an amorphous structure, and the like can be used properly. In addition, the active layer of the TFT may be formed of a semiamorphous semiconductor film (also referred to as a microcrystalline semiconductor film) having an intermediate structure between an amorphous structure and a crystalline structure (including a single crystal structure, and a polycrystalline structure). The semiamorphous semiconductor film has a third condition that is stable in terms of free energy, and includes a crystalline region having short range order along with lattice distortion. Further, at least a part of the semiamorphous semiconductor film contains a crystal grain of from 0.5 to 20.0 nm in size, and Raman spectrum is shifted to a lower wavenumbers than 520 $cm^{-1}$. The diffraction peak of (111) and (220), which is believed to be originated in a crystalline silicon lattice, is observed in the semiamorphous semiconductor film by X-ray diffraction. Further, the semiamorphous semiconductor film is added with hydrogen or halogen of at least 1 atom % or more as a neutralizing agent for dangling bonds. The semiamorphous semiconductor film is formed by glow discharge decomposition with silicide gas (by plasma CVD). As for the silicide gas, $SiH_4$, $Si_2H_6$, $SiH_2Cl_2$, $SiHCl_3$, $SiCl_4$, $SiF_4$, and the like can be used. The silicide gas may also be diluted with $H_2$, or a mixture of $H_2$ and one or more rare gas elements selected from He, Ar, Kr, and Ne. The dilution ratio may be in the range of from 1:2 to 1:1,000. The pressure may be approximately in the range of from 0.1 Pa to 133 Pa. The power frequency is in the range of from 1 MHz to 120 MHz, preferably from 13 MHz to 60 MHz. The substrate heating temperature may be set to 300° C. or less, preferably from 100° C. to 250° C. With respect to impurity elements contained in the film, each concentration of impurities for atmospheric constituents such as oxygen, nitrogen, and carbon is preferably set to $1\times10^{20}$ $cm^{-1}$ or less. In particular, the oxygen concentration is set to $5\times10^{19}/cm^3$ or less; more preferably, $1\times10^{19}/cm^3$ or less. The electron field-effect mobility $\mu$ of the TFT using the semiamorphous semiconductor film as its active layer is in the range of form 1 $cm^2$/Vsec to 10 $cm^2$/Vsec.

According to the invention, a lightweight semiconductor device having a highly reliable sealing structure of preventing the ingress of impurities such as moisture, which deteriorate the characteristics of an element, can be realized.

DETAILED DESCRIPTION OF THE INVENTION

Embodiment modes of the present invention will hereinafter be described.

Embodiment Mode 1

In Embodiment Mode 1, a peeling technique using a metal film and a silicon oxide film as disclosed in Japanese Patent Application Laid-Open No. 2003-174 is employed. According to the peeling and transferring technique disclosed in Japanese Patent Application Laid-Open No. 2003-174, a metal layer is formed over a substrate, and a metal oxide layer is formed in an interface between the metal layer and an oxide layer when laminating the oxide layer on the metal layer. By utilizing the metal oxide layer, peeling is performed in a subsequent step.

Concretely, a tungsten film is formed over a glass substrate by sputtering and then a silicon oxide film is laminated thereon by sputtering. When forming the silicon oxide film by sputtering, an amorphous tungsten oxide layer is formed. Elements such as a TFT are formed on the silicon oxide film. The substrate is subjected to a heat treatment of 400° C. or more in the element formation process such that the tungsten oxide layer is crystallized. When physical force is applied to the resultant substrate, peeling is caused inside of or at an interface of the tungsten oxide layer. Thus, the peeled layer (including the elements such as the TFT) thus obtained is transferred over a plastic substrate.

In the embodiment mode, only a protective film having superior barrier properties is transferred over the plastic substrate as a layer to be peeled.

A metal film 11, which is a tungsten film (with a thickness of from 10 to 200 nm, preferably, from 30 to 75 nm) here, is formed on a heat-resistant substrate 10 by sputtering. An oxide film 12, which is a silicon oxide film (with a thickness of from 150 to 200 nm) here, is laminated thereon without being exposed to atmospheric air. It is preferable that the thickness of the oxide film 12 be more than twice as large as that of the metal film. Although not illustrated in FIGS. 1A to 1G, an amorphous metal oxide film (which is a tungsten oxide film) with a thickness of about from 2 to 5 nm is formed between the metal film 11 and the silicon oxide film 12 upon lamination. When peeling is performed in the subsequent step, separation is caused inside the tungsten oxide film, or in an interface between the tungsten oxide film and the silicon oxide film, or in an interface between the tungsten oxide film and the tungsten film.

Since the films are also formed on the edge faces of the substrate by sputtering, and therefore, preferably removed by $O_2$ ashing and the like, selectively.

Figure 1A:
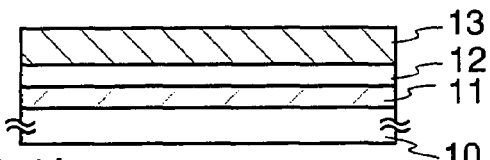
FIGS. 1A to 1G are cross sectional views showing steps according to Embodiment Mode 1.

Subsequently, a layer 13 to be peeled is made from an SOG film on the oxide layer 12 by application (FIG. 1A, this figure shows a state after forming the layer to be peeled). The layer 13 to be peeled is not particularly limited as long as a layer functions as a protective film. For example, an inorganic insulating film formed by PCVD or sputtering (such as a silicon oxide film, a silicon nitride film, a silicon oxynitride film, a thin film containing carbon as its main constituent (e.g., a DLC film, a CN film, an amorphous carbon film)); an SOG film formed by application (such as a SiOx film containing alkyl group using a siloxane coating film, and a SiOx film using a polysilazane coating film); and the like can be employed.

In the embodiment mode, a solution in which polysilazane is solved in a solvent is applied by spin coating, and then baked to form a SiOx film. As for the solvent, xylene, dibutyl ether, and cyclohexane can be used. When a solution containing polysilazane is applied and baked to form the layer 13 to be peeled, the substrate applied with the solution containing polysilazane is necessary to be baked at a temperature of from 120° C. to 450° C., preferably from 250° C. to 400° C. Therefor, the heat-resistant substrate 10 must be formed of a material that can withstand the baking temperatures. Accordingly, the solution containing polysilazane cannot be applied over a plastic substrate and baked since the plastic substrate cannot withstand the high baking temperatures. In accordance with the invention, however, the solution containing polysilazane is applied over the heat-resistant substrate 10 and baked to form the SiOx film in advance, and then the SiOx film is transferred over a plastic substrate.

The film immediately after the application of the solution containing polysilazane is an inorganic polymer composed of only a Si—H bond, a N—H bond, and a Si—N bond. When the film is baked under an atmosphere containing moisture, it is converted into a thin silica film. The density of the thin silica film obtained by baking at a temperature of 450° C. can be set to 2.1 to 2.2 g/cm³. Note that, in order to increase the thickness of the thin silica film, the baking temperatures should be set at rather low temperatures so that the degree of shrinkage for the film can be reduced in the baking. As compared with a film formed by the sol-gel technique, the thin silica film formed according to the above-mentioned steps has higher degree of shrinkage, thereby obtaining a dense film.

Meanwhile, in the case of forming a silica film by using the sol-gel technique, since an organic group partly remains, a dense film cannot be obtained, and limitation in the film thickness becomes as low as 0.5 μm or less.

Alternatively, when the solution containing polysilazane is applied and baked at a temperature of 800° C. or more under an atmosphere containing nitrogen, a SiN film can be formed.

At the time of application and baking mentioned above, the amorphous metal oxide film is crystallized by performing a heat treatment of 410° C. or more to obtain a metal oxide film with a crystalline structure (not illustrated in the drawings). Thus, hydrogen is dispersed. At the time of finishing the heat treatment of 410° C. or more, a relatively small force (e.g., human hands, gas pressure applied from a nozzle, ultrasonic waves, and the like) is applied to cause separation inside of the tungsten oxide film, or in an interface between the tungsten oxide film and the silicon oxide film, or in an interface between the tungsten oxide film and the tungsten film. Note that, when a heat treatment is carried out at high temperatures of enabling to crystallize the metal oxide film, the thickness of the metal oxide film is slightly reduced.

In the case of using a tungsten film as the metal film 11, it is preferable that the heat treatment be performed with a temperature of 410° C. or more. Meanwhile, when a molybdenum film or an alloy film of tungsten and molybdenum is used as the metal film 11, however, separation can be performed without performing the heat treatment.

In order to further improve the barrier properties, a SiN film may be laminated on the thin silica film by PCVD or sputtering.

Figure 1B:
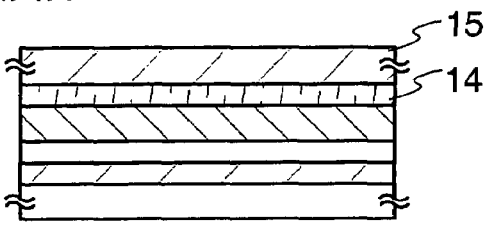

Next, a second substrate (a fixed substrate) 15 is attached to the layer 13 to be peeled with a first adhesive material 14 (or a first two-sided tape) (FIG. 1B, this figure shows a state after attaching the second substrate 15). It is preferable that the second fixed substrate be attached thereto under reduced pressure so as to prevent air bubbles from being generated in the attached surface. The layer 13 to be peeled is formed by application and functions as a planarization film, and therefore, it can be attached to the second substrate directly with a two-sided tape. A material, which can be removed later (for example, an adhesive material that is soluble in water or alcohols), can be used as the first adhesive material 14.

In order to perform the following peeling treatment easily, the adhesiveness between the metal film 11 and the oxide film 12 is partly reduced. The treatment for partly reducing the adhesiveness is carried out as follows: pressure or strong light is applied locally to the films along the rim of the region to be separated from outside so as to partly damage to the inside of the oxide film 12 or the interface between the oxide film and the metal film. For example, a scriber device, a laser irradiation device, and the like are used.

Figure 1C:
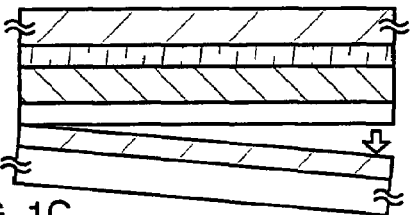

Thereafter, the first substrate 10 with the metal film 11 formed thereon is peeled off by using a physical means (FIG. 1C, this figure shows peeling process of the first substrate 10). They can be separated with a relatively small force (e.g., human hands, gas pressure applied from a nozzle, ultrasonic waves, and the like).

Note that the second fixed substrate may be attached to the bottom of the first substrate 10 with a second two-sided tape to prevent the substrate 10 from being broken due to the peeling treatment prior to separating the fist substrate 10 with the meal film formed thereon.

Figure 1D:
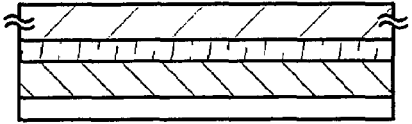

Consequently, the layer to be peeled that is formed over the silicon oxide layer 12 can be separated from the first substrate 10. FIG. 1D shows a state after being peeled off.

Figure 1E:
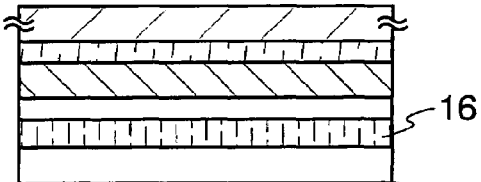

Subsequently, a third substrate 17 made from a plastic film is attached to the bottom of the oxide layer 12 with a second adhesive material 16 (FIG. 1E, this figure shows a state after attaching the first substrate 17). It is preferable that the third substrate 17 be attached thereto under reduced pressure so as not to generate air bubbles in the attached surface. As the second adhesive material 16, various kinds of curing adhesive materials including a reactive curing adhesive material, a heat curing adhesive material, a light curing adhesive material such as an ultraviolet curing adhesive material, and an anaerobic curing adhesive material can be employed. The third substrate 17 may be formed of synthetic resin that is composed of polypropylene, polypropylene sulfide, polycarbonate, poly ether imide, polyphenylene sulfide, polyphenylene oxide, poly sulfone, or polyphthalamide. In addition, a HT substrate (manufactured by Nippon Steel chemical Co., Ltd) with a Tg (glass transition) point of 400° C. or more may be used.

Figure 1F:
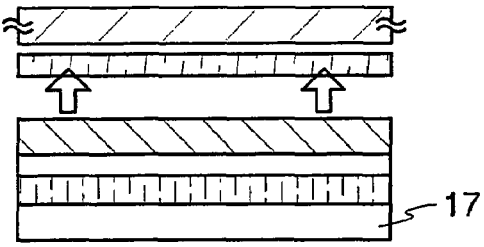

Subsequently, the first adhesive material 14 (or the first two-sided tape) and the second fixed substrate 15 are separated (FIG. 1F, this figure shows the peeling process of the second substrate). When the second fixed substrate 15 is attached to the layer 13 to be peeled with the two-sided tape, the second fixed substrate and the two-sided tape may be peeled off sequentially. Meanwhile, when the second fixed substrate 15 is attached to the layer 13 to be peeled with the adhesive material that is soluble in a solvent, the adhesive material may be soaked and dissolved in the solvent so as to separate the second fixed substrate.

According to the above-mentioned steps, a base material (that is the plastic film here) having the protective film (that is the dense silica film here) with the superior barrier properties can be manufactured. The base material having the protection film with the superior barrier properties is applicable to various kinds of base materials in a wide range of field as well as electric appliances. Conventionally, a thin film has been formed only over a heat-resistant substrate and could not be formed over a plastic film for the sake of processing. According to the invention, however, the thin film, which is formed on the heat-resistant substrate in advance, is peeled and transferred over a plastic substrate easily, hereby providing a plastic film having the protective film with superior barrier properties.

The base material having the protective film with superior barrier properties of the invention can be utilized as a coating film for various kinds of materials. For example, the base material of the invention is applicable to a coating film for a plastic card; a coating film for a window; a coating film for a display screen; a coating film for a metal component; and the like.

Figure 1G:
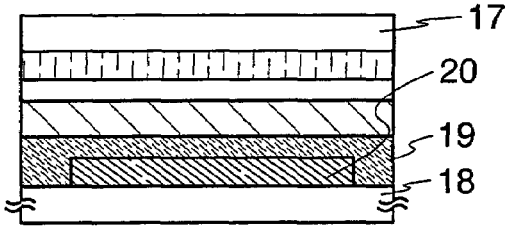

Next, the base material having the protective film with superior barrier properties is attached to a fourth substrate 18 with a third adhesive material 19 to encapsulate an element 20 formed on the fourth substrate 18 (FIG. 1G, this figure shows the attaching process between the third substrate and the element substrate). As the third adhesive material 19, various kinds of curing adhesive materials including a reactive curing adhesive material, a heat curing adhesive material, a light curing adhesive material such as an ultraviolet curing adhesive material, and an anaerobic curing adhesive material can be employed. Further, the third adhesive material 19 may be added with a gap material (such as fiber and spacer) for maintaining a gap between the substrates.

The element 20 is one or any combination of various semiconductor elements (such as a thin film diode, a photoelectric conversion element composed of silicon-based PIN junction, and a silicon resistance element); a memory; a piezoelectric element; a liquid crystal element; an electrophoresis element; an EL element; a coil; an inductor; a capacitor; and micro magnetic device.

Embodiment Mode 2

Figure 2A:
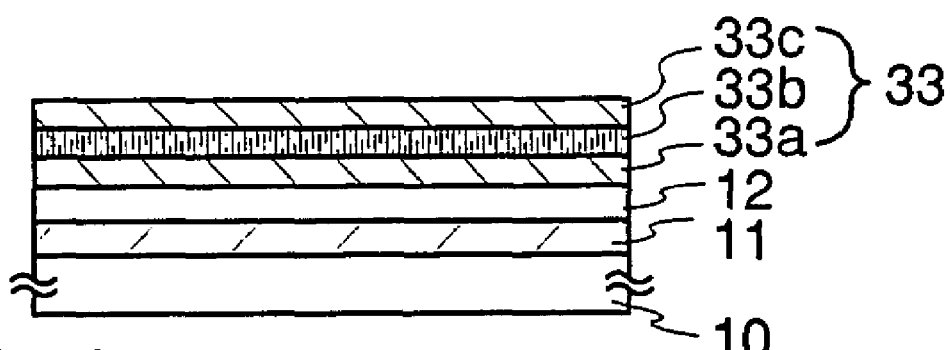
FIGS. 2A and 2B are cross sectional views showing steps according to Embodiment Mode 2.
Figure 2B:
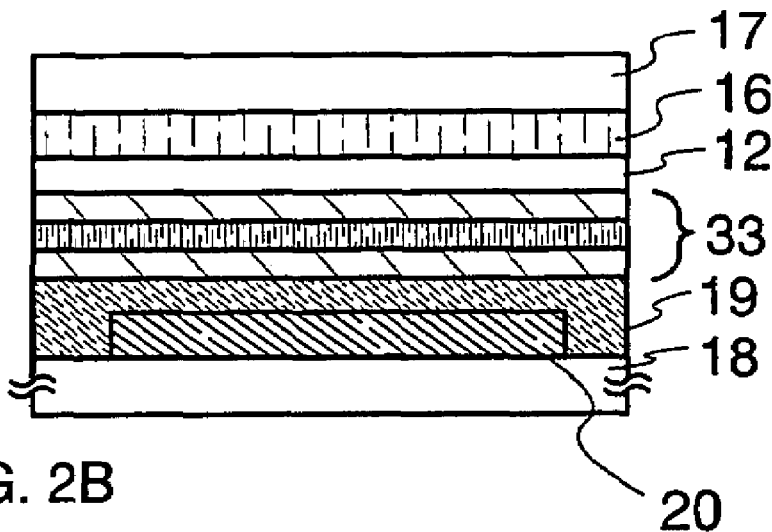

Differing from Embodiment Mode 1 that mainly explaining a single-layered protective film, Embodiment Mode 2 will show an example in which a protective lamination film including a stress relaxation film therein is peeled off and transferred with reference to FIGS. 2A and 2B. Note that, portions other than the protective lamination film are identical to those in Embodiment Mode 1, and will not be further explained. In FIGS. 2A and 2B, same portions as those in FIGS. 1A to 1G are denoted by same reference numerals.

The metal layer 11 and the oxide layer 12 are formed on the first substrate 10 in the same manner as Embodiment Mode 1. An inorganic insulating film, which becomes a first protective film 33a, is formed on the oxide layer 12 by PCVD. A planarized insulating film (a second protective film) is formed thereon as a stress relaxation layer 33b by application. An inorganic insulating film, which becomes a protective film 33c, is next formed on the stress relaxation layer 33b by PCVD (FIG. 2A).

The first protective film 33a and the third protective film 33c are made from any one of silicon oxide, silicon nitride, silicon oxynitride, and a thin carbon-based film (such as a DLC film, a CN film, and an amorphous carbon film), or a lamination of the above-mentioned materials.

The stress relaxation layer 33b may be formed of a photosensitive or non-photosensitive organic material (such as polyimide, acrylic, polyamide, polyimideamide, resist, and benzocyclobutene); or an SOG film formed by application (e.g., a SiOx film containing alkyl group using a siloxane coating film, and a SiOx film using a polysilazane coating film).

Conventionally, there has been a problem that stress cracking is easily caused when the thickness of a protective film is increased. According to the prevent invention, however, the protective lamination film has a lamination structure in which the stress relaxation layer is sandwiched between the inorganic insulating films, thereby increasing the total thickness of the protective film without causing stress cracking.

The subsequent steps can be carried out in accordance with Embodiment Mode 1. The first substrate 10 with the oxide layer formed thereon is separated, the protective lamination film formed on the oxide layer is transferred over the third substrate 17, and then the resultant third substrate is attached to the fourth substrate 18 with the element 20 formed thereon so as to encapsulate the element (FIG. 2B).

As set forth above, the element 20 can be sealed with the protective lamination film 33 having thick thickness in total.

The embodiment mode can be freely combined with Embodiment Mode 1.

Embodiment Mode 3

Differing from Embodiment Mode 1 showing an example in which a protective film is transferred over a film substrate and an element is sealed with the film substrate, Embodiment Mode 2 will show an example in which only a protective film is peeled off and transferred over a substrate with an element formed thereon to seal the element referring to FIGS. 3A to 3F. Note that, steps until forming the protective film are identical to those in Embodiment Mode 1, and will not be further explained. In FIGS. 3A to 3F, same portions as those in FIGS. 1A to 1G are denoted by same reference numerals.

Figure 3A:
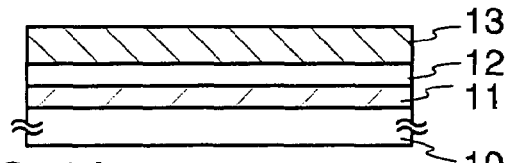
FIGS. 3A to 3F are cross sectional views showing steps according to Embodiment Mode 3.

The metal layer 11, the oxide layer 12, and the layer 13 to be peeled are sequentially formed on the first substrate 10 in the same manner as Embodiment Mode 1 (FIG. 3A, this figure shows a state after forming the layer to be peeled).

A protective layer made from an adhesive material that can be soluble in water or alcohols, that is, a water-soluble adhesive material 44 is applied on an entire surface of the layer 13 to be peeled and then baked.

One bonding surface of a two-sided tape 45 is adhered to the water-soluble adhesive material 44. It is preferable that the two-sided tape 45 be bonded thereto under reduced pressure so as not to generate air bubbles in the attached surface.

At this moment, a protection sheet covered on another bonding surface of the two-sided tape 45 is not peeled off. Another bonding surface of the two-sided tape 45 can be exposed by peeling the protection sheet in the subsequent step.

Figure 3B:
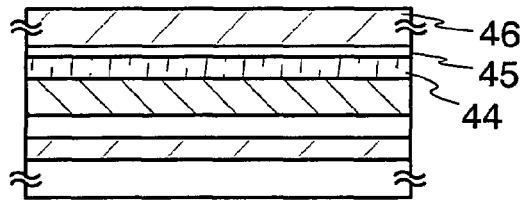

Next, the adhesiveness between the metal film 11 and the oxide film 12 are partly reduced to carry out a peeling treatment easily in the subsequent step. Subsequently, the protection sheet provided on another surface of the two-sided tape 45 is peeled off and attached with a second substrate (a fixed substrate) 46 (FIG. 3B). Similarly, it is preferable that the second substrate 46 be attached thereto under reduced pressure so as not to generate air bubbles in the attached surface.

Figure 3C:
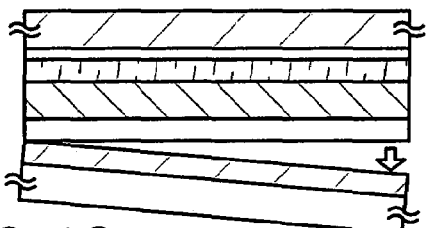

The first substrate 10 with the metal film 11 formed thereon is separated by using a physical means (FIG. 3C, this figure shows a peeling process of the first substrate 10). The first substrate with the metal film can be separated with a relatively small force (e.g., human hands, gas pressure applied from a nozzle, ultrasonic waves, and the like).

Note that the second fixed substrate 46 may be attached to the bottom of the first substrate 10 with a second two-sided tape so as to prevent the substrate 10 from being cracked due to the peeling treatment prior to separating the fist substrate 10.

Consequently, the layer to be peeled that is formed on the silicon oxide layer 12 can be separated from the first substrate 10.

Figure 3D:
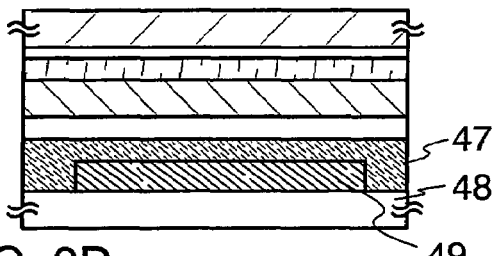

Thereafter, a third substrate 48, that has been previously prepared, is attached to the bottom of the oxide layer 12 with an adhesive material 47 (FIG. 3D, this figure shows a attaching process between the layer to be peeled and the element substrate). Note that an element 49 has been formed on the third substrate 48 in advance.

Figure 3E:
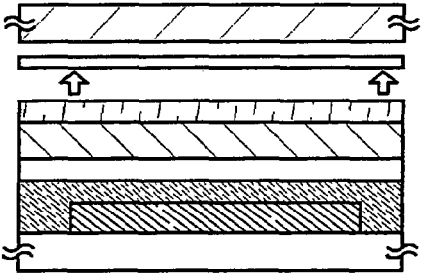

The two-sided tape 45 and the second fixed substrate 46 are separated, respectively (FIG. 3E).

Finally, the water-soluble adhesive material 44 is soaked and dissolved in water to be removed.

Figure 3F:
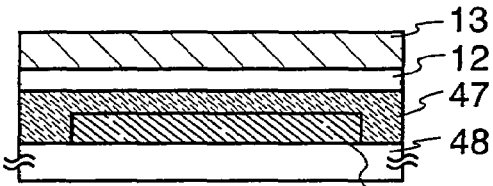

According to the above-mentioned steps, the element 49 can be sealed only with the protective layer with high yield (FIG. 3F, this figure shows a state after removing the water-soluble adhesive material).

In accordance with the above-described steps, it is possible to form a device having no substrate for fixing the protective layer. As a result, the device thus manufactured is useful for a device that is required to have high light transmittance in total and a device that is required to be lightweight.

The embodiment mode can be freely combined with Embodiment Mode 1 or Embodiment Mode 2.

Embodiment Mode 4

According to the invention, a protective film can be partly peeled off and transferred. An example thereof will be explained with reference to FIGS. 4A to 4D. FIGS. 4A to 4D shows cross sectional views of steps in which a protective film is partly transferred on a region other than a terminal electrode while exposing the terminal electrode.

Figure 4A:
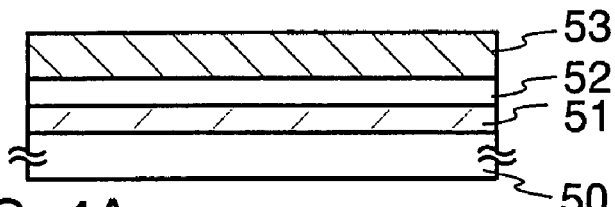
FIGS. 4A to 4D are cross sectional views showing steps according to Embodiment Mode 4.

A metal layer 51, an oxide layer 52, and a layer 53 to be peeled including a protective film are sequentially laminated on a first substrate 50 in the same manner as Embodiment Mode 1 (FIG. 4A, this figure shows a state after forming the layer to be peeled).

A pretreatment for reducing the adhesiveness selectively (partly) is carried out so as to cause separation phenomena easily. At this moment, separation of the protective film is triggered by being scribed or irradiated with laser beam so as to surround a pattern to be transferred.

In this embodiment mode, the pretreatment is carried out such that the layer 53 to be peeled is transferred only to a region overlapped with a sealing agent 58 and a first adhesive material, which are formed on a second substrate 55 that has been prepared previously. Note that the sealing agent 58 having an enclosed pattern is formed to surround a semiconductor element 56, and the first adhesive material is filled in a space surrounded with the sealing agent.

Figure 4B:
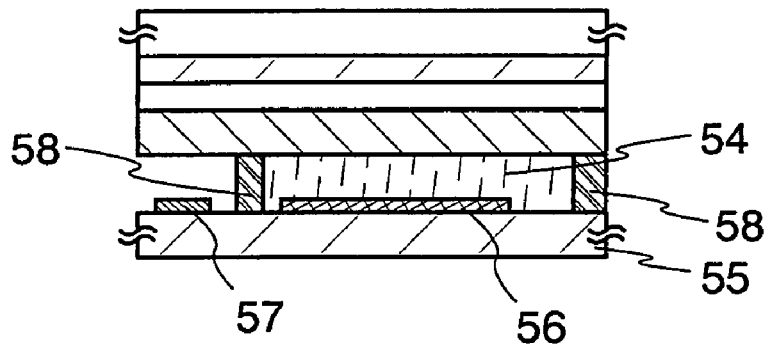
Figure 4C:
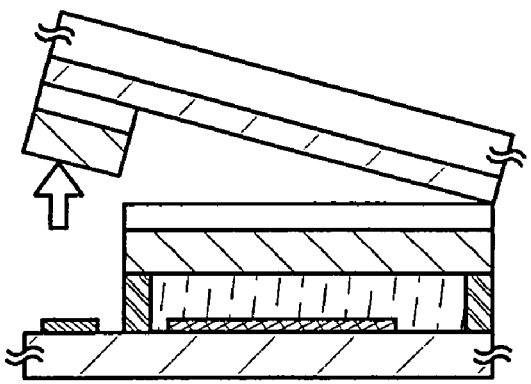

The first substrate 50 with the metal layer and the oxide layer formed thereon is attached to the resultant second substrate 55 (FIG. 4B, this figure shows a state after attaching the second substrate). A terminal electrode 57 for connecting to an external portion is also formed on the second substrate 55 along with the semiconductor element 56.

Thereafter, the first substrate 50 with the metal film 51 formed thereon is peeled off by using a physical means. At this moment, a part of the layer 53 to be peeled where is not in contact with the first adhesive material 54 and the sealing agent 58 is not peeled off and remains over the first substrate 50 (FIG. 4C, this figure shows the peeling process of the first substrate). The peeling treatment can be carried out with a relatively small force (e.g., human hands, gas pressure applied from a nozzle, ultrasonic waves, and the like).

Figure 4D:
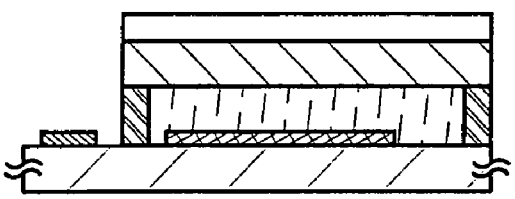

As a result, the layer to be peeled can be partly transferred in a self-aligning manner while exposing the terminal electrode 57 (FIG. 4D, this figure shows a state after peeling the first substrate).

Conventionally, when a protective film is directly formed on an element by application, a terminal electrode has been also coated with the protective film. Therefore, it has been necessary to perform a step for removing the protective film formed on the terminal electrode selectively, thereby increasing the number of steps. On the other hand, according to the present invention, the protective film formed by application is transferred on a region other than the terminal electrode, and hence, the steps can be reduced and simplified.

The embodiment mode can be freely combined with Embodiment Mode 1, Embodiment Mode 2, or Embodiment Mode 3.

The structures of the invention will be described in more detail in the following embodiments.

Embodiment 1

Figure 5A:
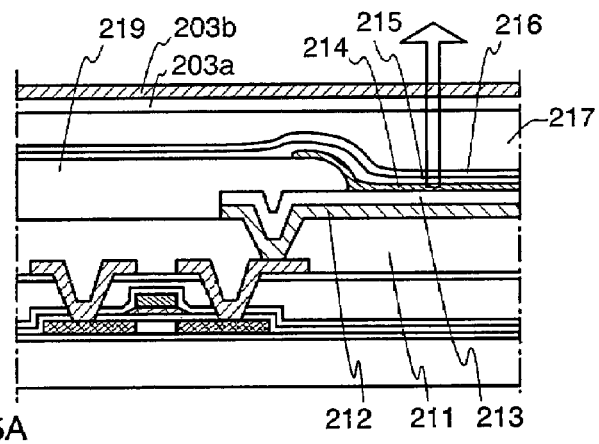
FIGS. 5A to 5D are cross sectional views explaining Embodiment 1 through Embodiment 4.

An example of a top-emission type light emitting device will be described with reference to FIG. 5A.

A TFT connecting to a light emitting element is formed over a substrate having an insulated surface. In the case of the top-emission structure, interlayer insulating films, a gate insulating film, and a base insulating film are not necessarily made from light-transmitting materials. In this embodiment, SiNO films formed by PCVD, which are highly stable material films, are used for first and third interlayer insulating films. A SiOx film formed by application, which is a highly stable material film, is employed as a second interlayer insulating film.

A fourth interlayer insulating film 211 is further formed. A SiOx film formed by application is also used for the fourth interlayer insulating film.

The fourth interlayer insulating film 211 is selectively etched to form a contact hole reaching an electrode of the TFT. Thereafter, a reflective metal film (an Al—Si film with a thickness of 30 nm), a material film with a high work function (a TiN film with a thickness of 10 nm), and a transparent conductive film (an ITSO film with a thickness of 10 nm to 100 nm) are successively formed. These films are next patterned to form a reflective electrode 212 and a first electrode 213 that are electrically connected to the TFT.

A partition wall 219 covering the end of the first electrode 213 is formed. The partition wall 219 can be formed of an inorganic material (such as silicon oxide, silicon nitride, and silicon oxynitride); a photosensitive or non-photosensitive organic material (such as polyimide, acrylic, polyamide, polyimideamide, a resist, and benzocyclobutene); an SOG film obtained by application (for example, an SiOx film including an alkyl group); or a lamination of these films.

Subsequently, a layer 214 containing an organic compound is formed by vapor deposition or application.

In order to form the top-emission type light emitting device, a second electrode 215 is formed of an aluminum film with a thickness of from 1 to 10 nm or an aluminum film containing minute amounts of Li. In addition, a transparent conductive film may be laminated thereon, if necessary.

A transparent protective layer 216 is formed on the second electrode 215 by vapor deposition or sputtering so as to protect the second electrode.

By utilizing the technique as described in Embodiment Mode 3, an oxide layer 203a and a protective film 203b made from an SOG film, which has been formed on a heat-resistant substrate in advance, are peeled off from the heat-resistant substrate, and transferred over the transparent protective layer 216. The oxide layer 203a and protective film 203b are then attached thereto with a sealing agent having an enclosed pattern and filler 217 composed of a transparent adhesive material so as to seal a light emitting element. Since the light emitting element can be sealed with the oxide layer and the protective film in the light emitting device thus manufactured, the light extraction efficiency can be increased as compared with the case where the light emitting element is sealed with a sealing substrate.

The filler 217 may be made from any light-transmitting materials. Typically, an ultraviolet curing or heat curing epoxy resin may be used as the filler. The light transmittance in total can be increased by filling the filler 217 between the substrates.

According to the above-mentioned steps, the top-emission type light emitting device is completed. In the embodiment, SiOx is added to each layers (i.e., the interlayer insulating films, the base insulating film, the gate insulating film, and the first electrode) such that the reliability of the light emitting device is enhanced.

In addition, the light emitting element is sealed with the protective layer 203b made from the dense SOG film such that the reliability of the light emitting device is further improved.

The embodiment can be freely combined with Embodiment Mode 1, Embodiment Mode 2, Embodiment Mode 3, or Embodiment Mode 4.

Embodiment 2

Figure 5B:
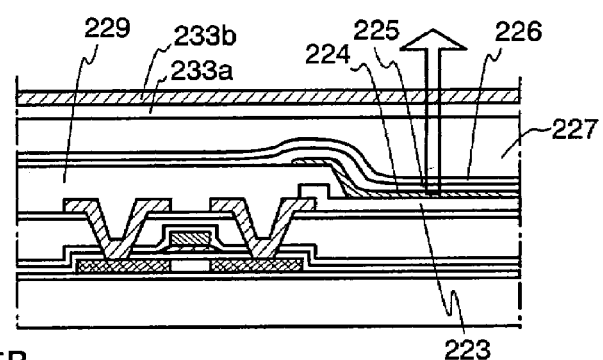

An example of a top-emission type light emitting device having a different structure of Embodiment 1 will be described with reference to FIG. 5B.

A TFT connecting to a light emitting element is formed over a substrate having an insulated surface. In the case of the top-emission structure, interlayer insulating films, a gate insulating film, and a base insulating film are not necessarily formed of light-transmitting materials. In this embodiment, SiNO films formed by PCVD, which are highly stable material films, are used for first and third interlayer insulating films. A second interlayer insulating film is a SiOx film formed by application, which is a highly stable material film. The interlayer insulating films and the gate insulating film are selectively etched to form a contact hole reaching an active layer of the TFT. A conductive film (TiN/Al—Sl/TiN) is formed and then etched (dry-etched using a mixed gas of $BCl_3$ and $Cl_2$) with use of a mask to form a source electrode and a drain electrode of the TFT.

A first electrode 223 being electrically connected to the drain electrode (or the source electrode) of the TFT is next formed. For example, the first electrode 223 may be formed of a material with a high work function such as an element selected from TiN, $TiSi^xN_y$, Ni, W, $WSi_x$, $WN_x$, $WSi_xN_y$, NbN, Cr, Pt, Zn, Sn, In, and Mo; or a film including an alloy material or a compound material that contains these elements as its principal constituent; or a lamination film of these elements to have a total thickness in the range of 100 to 800 nm.

A partition wall 229 for covering a peripheral edge of the first electrode 223 is formed. As the partition wall 229, an SOG film formed by application (for example, a SiOx film including an alkyl group) is used. The partition wall 229 is dry-etched to have a predetermined shape.

A layer 224 containing an organic compound is next formed by vapor deposition or application.

In order to form the top-emission type light emitting device, a second electrode 225 is made from an aluminum film with a thickness of from 1 to 10 nm or an aluminum film containing minute amounts of Li. Note that, a transparent conductive film (such as an ITSO film) may be laminated thereon, if necessary.

A transparent protective layer 226 is formed on the second electrode 225 by vapor deposition or sputtering to protect the second electrode.

By utilizing the technique as described in Embodiment Mode 3, an oxide layer 233a and a protective film 233b composed of an SOG film, which have been formed on a heat-resistant substrate in advance, are peeled off from the heat-resistant substrate, and transferred over the transparent protective layer 226. The oxide layer 233a and protective film 233b are attached to the transparent protective layer with a sealing agent having an enclosed pattern and filler 227 made from a transparent adhesive material such that a light emitting element is sealed. The light emitting element is sealed with the oxide layer and protective film in the light emitting device thus manufactured, and hence, the light extraction efficiency can be increased as compared with the case of sealing the light emitting element with a sealing substrate.

The filler 227 may be formed of any light-transmitting materials. Typically, an ultraviolet curing or heat curing epoxy resin may be used as the filler. The light transmittance in total can be improved by filling the filler 227 between the pair of substrates.

According to the above-mentioned steps, the top-emission type light emitting device is completed. In the embodiment, SiOx is added to each layers (i.e., the interlayer insulating films, the base insulating film, the gate insulating film, and the partition wall), thereby improving the reliability of the light emitting device.

In addition, the light emitting element is sealed with the protective layer 233b composed of the dense SOG film such that the reliability of the light emitting device is further increased.

The embodiment can be freely combined with Embodiment Mode 1, Embodiment Mode 2, Embodiment Mode 3, or Embodiment Mode 4.

Embodiment 3

Figure 5C:
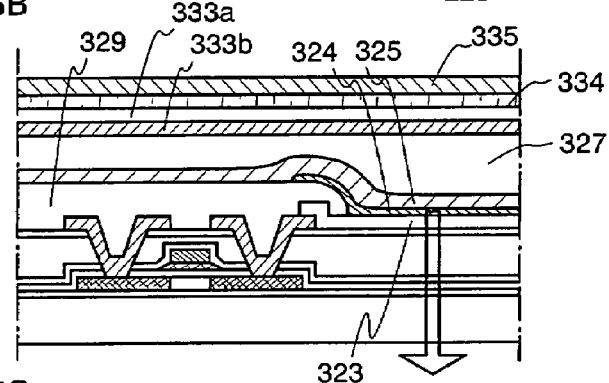

An example of a bottom-emission type light emitting device will be described with reference to FIG. 5C.

A TFT connecting to a light emitting element is formed over a transparent substrate (a glass substrate with a refractive index of about 1.55). In the case of forming the bottom-emission structure, interlayer insulating films, a gate insulating film, and a base insulating film are formed of materials having high light-transmitting properties. In the present embodiment, SiNO films formed by PCVD are used as first and third interlayer insulating films. Meanwhile, a SiOx film formed by application is used as a second interlayer insulating film.

A first electrode 323 being electrically connected to the TFT is next formed. The first electrode 323 is made from an ITSO film (100 nm in thickness), which is a transparent conductive film containing SiOx. The ITSO film is formed by sputtering using a target of indium tin oxide mixed with 1 to 10% silicon oxide ($SiO_2$) under the condition that a flow rate of Ar gas is set at 120 sccm; a flow rate Of $O_2$ gas, 5 sccm; pressure, 0.25 Pa; and electric power, 3.2 kW. After forming the ITSO film, a heat treatment is carried out at a temperature of 200° C. for one hour.

A partition wall 329 covering a peripheral edge of the first electrode 323 is formed. The partition wall 329 can be formed of an inorganic material (such as silicon oxide, silicon nitride, and silicon oxynitride); a photosensitive or non-photosensitive organic material (such as polyimide, acrylic, polyamide, polyimideamide, a resist, and benzocyclobutene); an SOG film (for example, an SiOx film including an alkyl group) obtained by application; or a lamination of these films.

In the embodiment, the partition wall 329 is patterned by wet etching such that only an upper edge portion of the partition wall has a curved surface with a radius of curvature. For example, it is preferable that the partition wall 329 be made from a positive photosensitive acrylic so that only the upper edge portion of the partition wall has a curved surface with a radius of curvature. Either a negative photosensitive acrylic that is insoluble in etchant due to irradiation of light or a positive photosensitive acrylic that is soluble in etchant due to irradiation of light can be used as the partition wall.

Subsequently, a layer 324 containing an organic compound is formed by vapor deposition and application. In the embodiment, a light emitting element that emits green light is formed. CuPc (20 nm in thickness) and NPD (40 nm in thickness) are laminated by vapor deposition, and $Alq_3$ doped with DMQd (37.5 nm in thickness), $Alq_3$ (37.5 nm in thickness), and $CaF_2$ (1 nm in thickness) are further laminated sequentially by co-deposition.

A second electrode 325 may be composed by laminating an alloy of MgAg, MgIn, AlLi, $CaF_2$, CaN, and the like, or a film formed by co-depositing aluminum and an element belonging to group 1 or 2 of the periodic table. In the embodiment, Al is vapor deposited to have a thickness of 200 nm as the second electrode. Note that, a protective film may be laminated thereon, if necessary.

By utilizing the technique as described in Embodiment Mode 3, an oxide layer 333a and a protective film 333b made from an SOG film, which have been formed on a heat-resistant substrate in advance, are peeled off from the heat-resistant substrate, and transferred over a film substrate 335. Then, the film substrate 335 with the protective film 333b and the oxide layer 333a formed thereon is attached to the transparent substrate with the light emitting element formed thereon by using a sealing agent having an enclosed pattern and filler 327 made from a transparent adhesive material so that the light emitting element is sealed.

The material for the filler 327 is not particularly limited. Typically, an ultraviolet curing or heat curing epoxy resin may be used as the filler.

According to the above-mentioned steps, the bottom-emission type light emitting device is completed. In the embodiment, the refractive indices and thicknesses of each layers (i.e., the interlayer insulating films, the base insulating film, the gate insulating film, and the first electrode) are determined in adjustable ranges so that the reflection of light is suppressed in each interface of the layers, hereby increasing the light extraction efficiency.

The embodiment can be freely combined with Embodiment Mode 1, Embodiment Mode 2, Embodiment Mode 3, or Embodiment Mode 4.

Embodiment 4

An example of a dual-emission type light emitting device, which can emit light upward and downward through both substrates, will be described with reference to FIG. 5D.

A TFT connecting to a light emitting element is formed over a transparent substrate (i.e., a glass substrate with a refractive index of about 1.55). Interlayer insulating films, a gate insulating film, and a base insulating film are formed of materials having high light-transmitting properties so as to transmit light therethrough to display images. In the present embodiment, SiNO films formed by PCVD are used as first and third interlayer insulating films. A SiOx film formed by application is used as a second interlayer insulating film.

A first electrode 423 being electrically connected to the TFT is next formed. The first electrode 423 is made from an ITSO film (100 nm in thickness), which is a transparent conductive film containing SiOx.

A partition wall 429 covering a peripheral edge portion of the first electrode 423 is formed. The partition wall 429 can be formed of an inorganic material (such as silicon oxide, silicon nitride, and silicon oxynitride); a photosensitive or non-photosensitive organic material (such as polyimide, acrylic, polyamide, polyimideamide, a resist, and benzocyclobutene); an SOG film obtained by application (for example, an SiOx film including an alkyl group); or a lamination of these films.

In the embodiment, the partition wall 429 is patterned by wet etching such that only an upper edge portion of the partition wall has a curved surface with a radius of curvature.

A layer 424 containing an organic compound is formed by vapor deposition or application.

In order to emit light upwardly, a second electrode 425 is formed of an aluminum film with a thickness of from 1 to 10 nm or an aluminum film containing minute amounts of Li. Note that, a transparent conductive film may be laminated thereon, if necessary.

Subsequently, a transparent protective layer 426 is formed on the second electrode 425 by vapor deposition or sputtering so as to protect the second electrode.

By using the technique as described in Embodiment Mode 3, an oxide layer 433a and a protective film 433b made from an SOG film, which has been formed on a heat-resistant substrate in advance, are peeled off from the heat-resistant substrate, and transferred over the transparent protective layer 426. Then, the oxide layer and protective film are attached to the transparent protective layer with a sealing agent having an enclosed pattern and filler 427 composed of a transparent adhesive material so as to seal the light emitting element. The light emitting element is sealed with the oxide layer and protective film in the light emitting device thus manufactured, and therefore, the light extraction efficiency can be increased as compared with the case of sealing the light emitting element with a sealing substrate.

The filler 427 may be made from any material having the light-transmitting properties. Typically, an ultraviolet curing or heat curing epoxy resin may be used as the filler. Furthermore, the light transmittance in total can be improved by filling the filler 427 between the pair of substrates.

Furthermore, the light emitting element is sealed with the protective layer 433b made from the dense SOG film, thereby improving the reliability of the light emitting device.

Figure 5D:
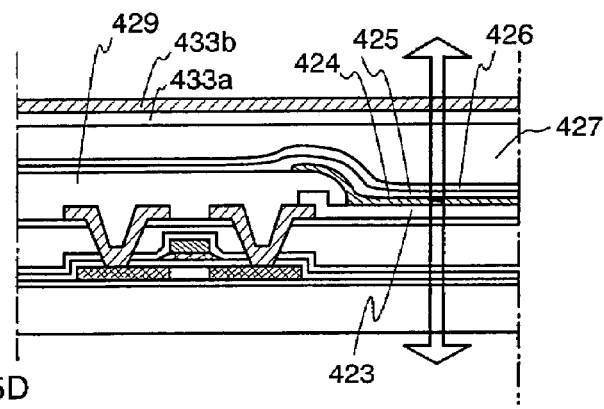

With respect to the dual-emission (both top and bottom emissions) light emitting device as shown in FIG. 5D, two pieces of polarizing plates are disposed sandwiching a light emitting panel so that a direction of polarization becomes perpendicular to the polarizing plates, thereby preventing a display from being hard to be recognized because of transparency to see a background when seen from one side.

The embodiment can be freely combined with Embodiment Mode 1, Embodiment Mode 2, Embodiment Mode 3, or Embodiment Mode 4.

Embodiment 5

An example of an inverted-stagger type TFT will be described with reference to FIGS. 6A and 6B.

Figure 6A:
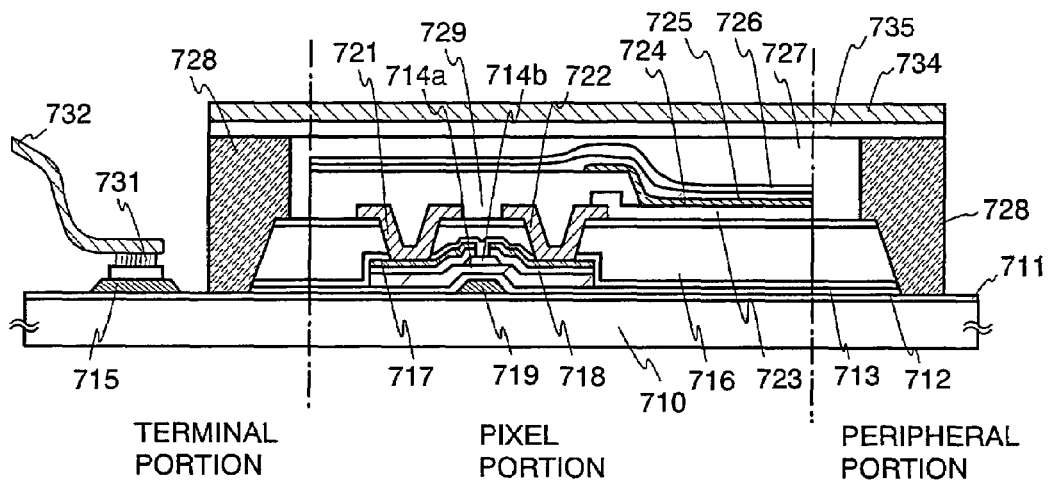
FIGS. 6A and 6B are cross sectional views explaining Embodiment 5.

FIG. 6A shows a channel stopper type TFT of an n-channel type, which is formed over a substrate 710. A gate electrode 719 and a terminal electrode 715 are simultaneously formed. A semiconductor layer 714a made from an amorphous semiconductor film, an n+ layer 718, and a metal layer 717 are laminated on a gate insulating film 712. A channel stopper 714b is formed at an upper portion of the semiconductor layer 714a, where will be a channel formation region. Further, source electrode or drain electrode 721 and 722 are formed.

A light emitting element connecting to the TFT utilizes a layer 724 containing an organic compound as a light emitting layer.

In order to form the n-channel type TFT as shown in FIG. 6A, the TFT is connected to a cathode 723. An electron transporting layer, a light emitting layer, a hole transporting layer, a hole injecting layer, and an anode 725 are sequentially laminated on the cathode 723.

By using the technique as described in Embodiment Mode 4, an oxide layer 735 and a protective film 734, which have been formed on a heat-resistant substrate in advance, are peeled off from the heat-resistant substrate, and transferred over the substrate 710, selectively. Then, the oxide layer and protective film are partly attached to the substrate 710 with a sealing agent 728 having an enclosed pattern and filler 727 made from a transparent adhesive material so as to seal the light emitting element. The light emitting element can be sealed with the oxide layer and protective film in the light emitting device thus manufactured.

The material for the filler 727 is not particularly limited. Typically, an ultraviolet curing or heat curing epoxy resin may be used as the filler.

Figure 6B:
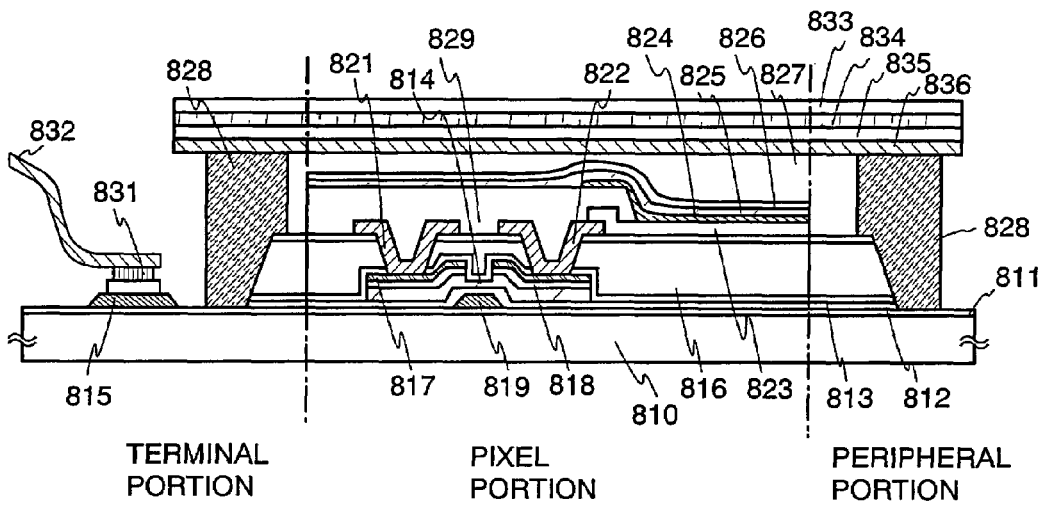

On the other hand, FIG. 6B shows a channel etched TFT of an n-channel type. A gate electrode 819 and a terminal electrode 815 are simultaneously formed. A semiconductor layer 814 made from an amorphous semiconductor film, an n+ layer 818, and a metal layer 817 are laminated on a gate insulating film 812. A part of the semiconductor layer 814 where becomes a channel formation region is etched thinly. Further, source or drain electrode 821 and 822 are formed. A light emitting element being in contact with the TFT utilizes a layer 824 containing an organic compound as a light emitting layer.

In order to form the n-channel type TFT as shown in FIG. 6B, the TFT is connected to a cathode 823. An electron transporting layer, a light emitting layer, a hole transporting layer, a hole injecting layer, and an anode 825 are sequentially laminated on the cathode 823.

By utilizing the technique as described in Embodiment Mode 1, an oxide layer 835 and a protective film 836, which have been formed on a heat-resistant substrate in advance, are peeled off from the heat-resistant substrate, and transferred over a film substrate 833. The resultant film substrate 833 is attached to the substrate 810 with a sealing agent 828 having an enclosed pattern and filler 827 composed of a transparent adhesive material so as to seal the light emitting element. The light emitting element can be sealed with the film substrate with the oxide layer and protective film formed thereon in the light emitting device thus manufactured.

Note that the film substrate 833 fixes the protective film 836 and the oxide layer 835 with an adhesive material 834.

The material for the filler 827 is not particularly limited. Typically, an ultraviolet curing or heat curing epoxy resin may be used as the filler.

As substitute for the amorphous semiconductor film, it is possible to use a semiamorphous semiconductor film (also referred to as a microcrystalline semiconductor film), which includes an intermediate structure between an amorphous structure and a crystalline structure (including a single crystal structure and a poly crystalline structure), a third condition that is stable in terms of free energy, and a crystalline region having short-range order along with lattice distortion.

The embodiment can be freely combined with Embodiment Mode 1, Embodiment Mode 2, Embodiment Mode 3, or Embodiment Mode 4.

Embodiment 6

Various kinds of modules (such as an active matrix EL module, a passive matrix EL module, a liquid crystal display device, and an active matrix EC module) can be achieved according to the invention. That is, all the electronic appliances incorporated with the various kinds of modules can be completed by implementing the present invention.

Examples of the electronic appliances include a video camera; a digital camera; a head-mounted display (a goggle-type display); a car navigation system; a projector; a car stereo; a personal computer; a card; a portable information terminal (such as a mobile computer, a cellular phone, and an electronic book); and the like.

The invention is further applicable to various kinds of coating films, besides the above-mentioned electronic appliances.

Practical examples thereof are shown in FIGS. 7A to 7C and FIG. 8.

Figure 7A:
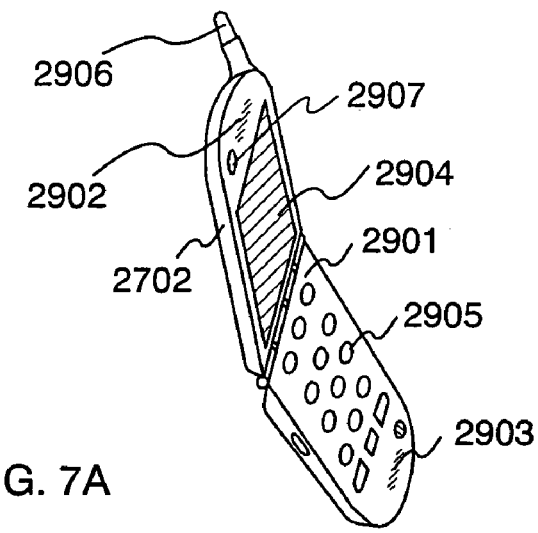
FIGS. 7A to 7C are diagrams showing examples of electronic appliances.

FIG. 7A is a cellular phone including a main body 2901; an audio output portion 2902; an audio input portion 2903; a display portion 2904; operation switches 2905; an antenna 2906; an image input portion 2907 (such as a CCD and an image sensor); and the like. According to the invention, a display device can be made thinner by transferring only a protective film having superior barrier properties, and therefore, the total weight of the cellular phone can be reduced.

Figure 7B:
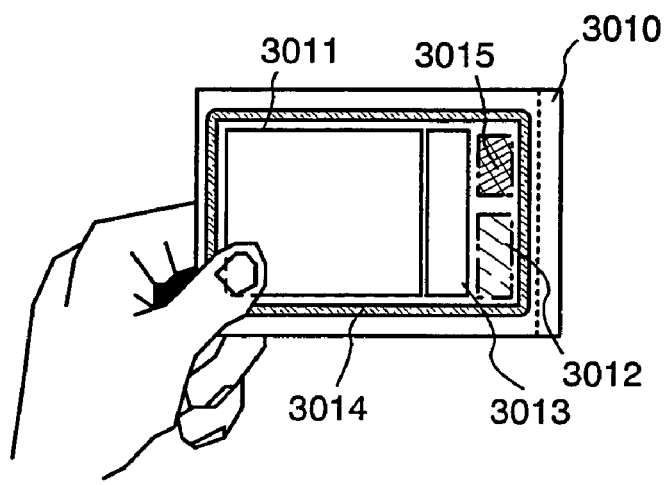

FIG. 7B shows a card or a card-type portable information terminal, including a display portion 3011; a driver circuit portion 3013; a functional circuit portion 3012 such as a CPU; a sealing pattern 3014; a buttery 3015; and a flexible substrate 3010. Further, a protective film having superior barrier properties can be transferred over a plastic card on which the display portion and circuits such as a functional circuit are not formed.

Figure 7C:
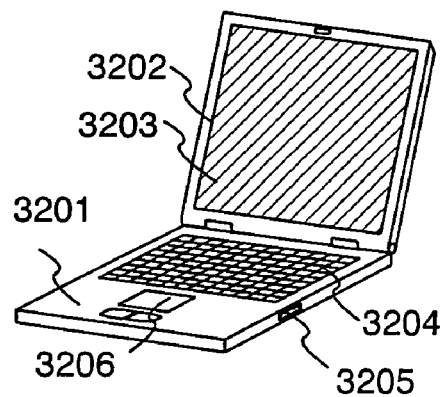

FIG. 7C is a personal laptop computer including a main body 3201; a casing 3202; a display portion 3203; a keyboard 3204; an external connection port 3205; a pointing mouse 3206; and the like. By transferring a protective film having superior barrier properties according to the invention, protection of the display portion can be reinforced.

Figure 8:
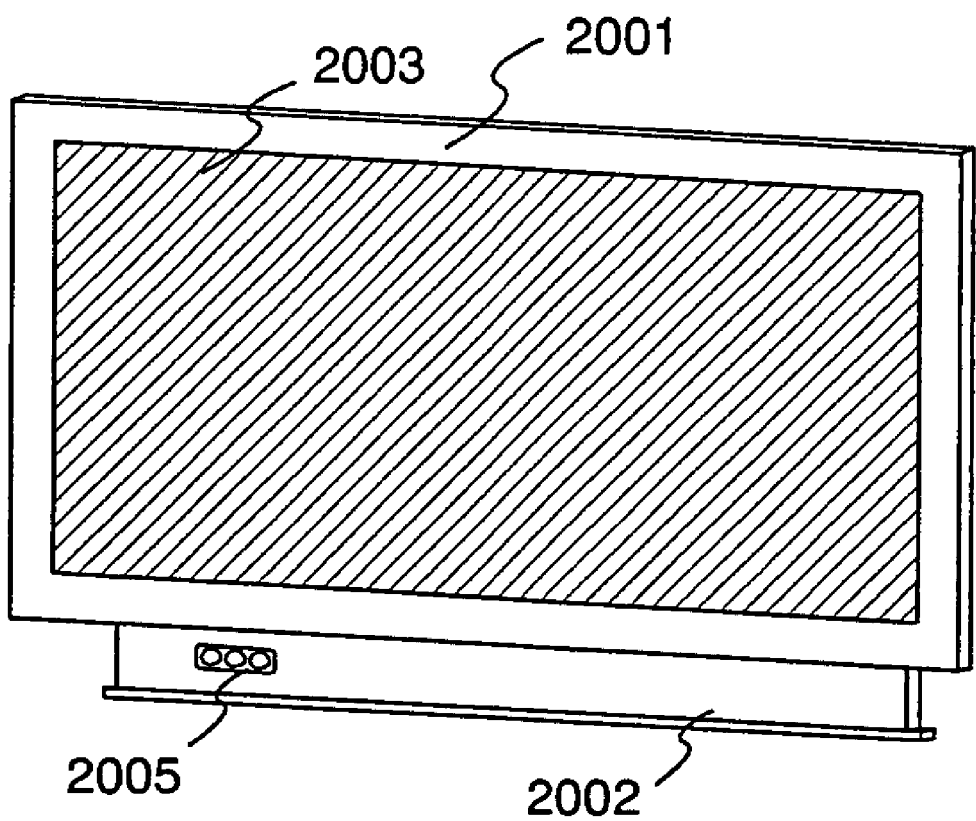
FIG. 8 is a diagram showing an example of an electronic appliance.

FIG. 8 is a television including a casing 2001; a supporting base 2002; a display portion 2003; a video input terminal 2005; and the like. By transferring a protective film having superior barrier properties according to the invention, protection of the display portion can be reinforced. The television includes every television for displaying information such as one for a personal computer, for receiving TV broadcasting, and for advertisement.

As set forth above, the semiconductor device and the base material manufactured according to the invention can be used for components of various kinds of electronic appliances. A semiconductor device manufactured according to any one of Embodiment Mode 1 through Embodiment Mode 4, and Embodiment 1 through Embodiment 5 can be used for the electronic appliances of the present embodiment.

According to the invention, a dense thin film, which has been conventionally impossible to be formed on a low heat-resistance substrate for the sake of processing, can be peeled off easily from a heat-resistance substrate, thereby providing a protective film with superior barrier properties.

What is claimed is:

1. A method of manufacturing a base material, comprising the steps of:
   forming a layer to be peeled including a protective film, over a first substrate;
   attaching a second substrate to the layer to be peeled with a first adhesive material;
   peeling the first substrate from the layer to be peeled;
   attaching a third substrate to the layer to be peeled with a second adhesive material;
   peeling the second substrate from the layer to be peeled by removing the first adhesive material;
   forming an element over a fourth substrate; and
   attaching the element to the layer to be peeled with a third adhesive material.

2. The method of manufacturing the base material according to claim 1, wherein the element includes a light emitting element.

3. The method of manufacturing the base material according to claim 1, wherein the element includes a semiconductor element.

4. The method of manufacturing the base material according to claim 1, wherein the protective film includes at least one of an inorganic insulating film and an SOG film.

5. The method of manufacturing the base material according to claim 1, wherein the layer to be peeled further including a stress relaxation film.

6. The method of manufacturing the base material according to claim 1, wherein the third substrate is a film base material.

7. The method of manufacturing the base material according to claim 1, wherein the first adhesive material comprises a material which can be solved with a solvent.

8. The method of manufacturing the base material according to claim 1, wherein the first adhesive material comprises a two-sided tape.

9. The method of manufacturing the base material according to claim 1, wherein the base material is used in one selected from the group consisting of a cellular phone, a card type portable information terminal, a personal laptop computer, and television.

10. The method of manufacturing the base material according to claim 4, wherein the inorganic insulating film comprises any one of a silicon oxide, a silicon nitride, and a silicon oxynitride formed by any one of PCVD, sputtering, and application.

11. The method of manufacturing the base material according to claim 5, wherein the stress relaxation film is an organic resin film or an SOG film.

12. A method of manufacturing a base material, comprising the steps of:
   forming a layer to be peeled including a protective film, over a first substrate;
   forming a first element over a second substrate;
   forming a second element over a second substrate;
   forming a sealing agent having an enclosed pattern to surround the first element, over substrate;
   attaching a adhesive material inside of the sealing agent, over the first element;
   attaching the layer to be peeled to the adhesive material; and
   peeling the first substrate from the layer to be peeled.

13. The method of manufacturing the base material according to claim 12, wherein the element includes a light emitting element.

14. The method of manufacturing the base material according to claim 12, wherein the element includes a semiconductor element.

15. The method of manufacturing the base material according to claim 12, wherein the protective film includes at least one of an inorganic insulating film and an SOG film.

16. The method of manufacturing the base material according to claim 12, wherein the layer to be peeled further including a stress relaxation film.

17. The method of manufacturing the base material according to claim 12, wherein the first adhesive material comprises a material which can be solved with a solvent.

18. The method of manufacturing the base material according to claim 12, wherein the first adhesive material comprises a two-sided tape.

19. The method of manufacturing the base material according to claim 12, wherein the base material is used in one selected from the group consisting of a cellular phone, a card type portable information terminal, a personal laptop computer, and television.

20. The method of manufacturing the base material according to claim 15, wherein the inorganic insulating film comprises any one of a silicon oxide, a silicon nitride, and a silicon oxynitride formed by any one of PCVD, sputtering, and application.

21. The method of manufacturing the base material according to claim 16, wherein the stress relaxation film is an organic resin film or an SOG film.

22. A method of manufacturing a base material, comprising the steps of:
   forming a layer to be peeled including:
   a first protective film over a first substrate,
   a stress relaxation film over the first protective film, and
   a second protective film over the stress relaxation film,
   attaching a second substrate to the layer to be peeled with a first adhesive material;
   peeling the first substrate from the layer to be peeled;
   attaching a third substrate to the layer to be peeled with a second adhesive material;
   peeling the second substrate from the layer to be peeled by removing the first adhesive material;
   forming an element over a fourth substrate; and
   attaching the element to the layer to be peeled with a third adhesive material.

23. The method of manufacturing the base material according to claim 22, wherein the element includes a light emitting element.

24. The method of manufacturing the base material according to claim 22, wherein the element includes a semiconductor element.

25. The method of manufacturing the base material according to claim 22, wherein any one of the first and the second protective film includes at least one of an inorganic insulating film and an SOG film.

26. The method of manufacturing the base material according to claim 22, wherein the stress relaxation film is an organic resin film or an SOG film.

27. The method of manufacturing the base material according to claim 22, wherein the third substrate is a film base material.

28. The method of manufacturing the base material according to claim 22, wherein the first adhesive material comprises a material which can be solved with a solvent.

29. The method of manufacturing the base material according to claim 22, wherein the first adhesive material comprises a two-sided tape.

30. The method of manufacturing the base material according to claim 22, wherein the base material is used in one selected from the group consisting of a cellular phone, a card type portable information terminal, a personal laptop computer, and television.

31. The method of manufacturing the base material according to claim 25, wherein the inorganic insulating film comprises any one of a silicon oxide, a silicon nitride, and a silicon oxynitride formed by any one of PCVD, sputtering, and application.

32. A method of manufacturing a base material, comprising the steps of:
forming a layer to be peeled including:
a first protective film over a first substrate,
a stress relaxation film over the first protective film, and
a second protective film over the stress relaxation film,
forming a first element over a second substrate;
forming a second element over a second substrate;
forming a sealing agent having an enclosed pattern to surround the first element, over substrate;
attaching a adhesive material inside of the sealing agent, over the first element;
attaching the layer to be peeled to the adhesive material; and
peeling the first substrate from the layer to be peeled.

33. The method of manufacturing the base material according to claim 32, wherein the element includes a light emitting element.

34. The method of manufacturing the base material according to claim 32, wherein the element includes a semiconductor element.

35. The method of manufacturing the base material according to claim 32, wherein any one of the first and the second protective film includes at least one of an inorganic insulating film and an SOG film.

36. The method of manufacturing the base material according to claim 32, wherein the stress relaxation film is an organic resin film or an SOG film.

37. The method of manufacturing the base material according to claim 32, wherein the first adhesive material comprises a material which can be solved with a solvent.

38. The method of manufacturing the base material according to claim 32, wherein the first adhesive material comprises a two-sided tape.

39. The method of manufacturing the base material according to claim 32, wherein the base material is used in one selected from the group consisting of a cellular phone, a card type portable information terminal, a personal laptop computer, and television.

40. The method of manufacturing the base material according to claim 35, wherein the inorganic insulating film comprises any one of a silicon oxide, a silicon nitride, and a silicon oxynitride formed by any one of PCVD, sputtering, and application.

41. A method of manufacturing a semiconductor device, comprising the steps of:
forming a layer to be peeled including a protective film, over a first substrate;
forming a first element over a second substrate;
forming a second element over a second substrate;
forming a sealing agent having an enclosed pattern to surround the first element, over substrate;
attaching a adhesive material inside of the sealing agent, over the first element;
attaching the layer to be peeled to the adhesive material; and
peeling the first substrate from the layer to be peeled.

42. The method of manufacturing the semiconductor device according to claim 41, wherein the protective film includes at least one of an inorganic insulating film and an SOG film.

43. The method of manufacturing the semiconductor device according to claim 41, wherein the inorganic insulating film comprises any one of a silicon oxide, a silicon nitride, and a silicon oxynitride formed by any one of PCVD, sputtering, and application.

44. The method of manufacturing the semiconductor device according to claim 41, wherein the layer to be peeled further including a stress relaxation film.

45. The method of manufacturing the semiconductor device according to claim 41, wherein the base material is used in one selected from the group consisting of a cellular phone, a card type portable information terminal, a personal laptop computer, and television.

46. The method of manufacturing the semiconductor device according to claim 44, wherein the stress relaxation film is an organic resin film or an SOG film.

* * * * *